United States Patent
Smeets et al.

(10) Patent No.: US 7,716,822 B2
(45) Date of Patent: May 18, 2010

(54) METHOD OF MOVING AT LEAST TWO ELEMENTS OF A PLACEMENT MACHINE

(75) Inventors: Benjamin C. H. Smeets, Eindhoven (NL); Josephus M. M. Van Gastel, Eindhoven (NL)

(73) Assignee: Assembleon N.V., La Veldhoven (NL)

( * ) Notice: Subject to any disclaimer, the term of this patent is extended or adjusted under 35 U.S.C. 154(b) by 1016 days.

(21) Appl. No.: 10/534,109

(22) PCT Filed: Nov. 4, 2003

(86) PCT No.: PCT/IB03/04928

§ 371 (c)(1),
(2), (4) Date: Dec. 30, 2005

(87) PCT Pub. No.: WO2004/043126

PCT Pub. Date: May 21, 2004

(65) Prior Publication Data
US 2006/0123627 A1  Jun. 15, 2006

(30) Foreign Application Priority Data
Nov. 8, 2002 (EP) .................................. 02079684

(51) Int. Cl.
*H05K 3/30* (2006.01)
(52) U.S. Cl. ............................. 29/832; 29/739; 29/740; 29/741; 29/840
(58) Field of Classification Search .................. 29/832, 29/833, 840, 739, 740, 741

See application file for complete search history.

(56) References Cited

U.S. PATENT DOCUMENTS

| | | | | |
|---|---|---|---|---|
| 4,631,816 A | * | 12/1986 | Fujita et al. | 29/740 |
| 4,794,689 A | * | 1/1989 | Seno et al. | 29/740 |
| 4,809,430 A | * | 3/1989 | Maruyama et al. | 29/834 |
| 5,060,366 A | * | 10/1991 | Asai et al. | 29/739 |
| 5,153,983 A | * | 10/1992 | Oyama | 29/740 |
| 5,862,586 A | * | 1/1999 | Kimura | 29/832 |
| 5,864,944 A | * | 2/1999 | Kashiwagi et al. | 29/833 |
| 6,397,456 B1 | * | 6/2002 | Roos | 29/740 |
| 7,020,953 B2 | * | 4/2006 | Ueno et al. | 29/740 |
| 7,191,511 B2 | * | 3/2007 | Noda et al. | 29/740 |
| 2002/0079712 A1 | * | 6/2002 | Mehdianpour | 294/87.1 |
| 2003/0110610 A1 | * | 6/2003 | Duquette et al. | 29/407.09 |
| 2004/0026938 A1 | * | 2/2004 | Junge | 294/2 |

FOREIGN PATENT DOCUMENTS

| | | |
|---|---|---|
| JP | 10229298 | 8/1998 |
| JP | 2000097278 | 4/2000 |

* cited by examiner

*Primary Examiner*—C. J Arbes
(74) *Attorney, Agent, or Firm*—Foley & Lardner LLP

(57) ABSTRACT

A method and placement device are provided for moving at least two elements in and opposite to a predetermined direction. The second element is simultaneously moved by means of the first element. The first element is moved in the predetermined direction, whereas the second element is moved relative to the first element in a direction opposite to the predetermined direction and vice versa.

7 Claims, 1 Drawing Sheet

METHOD OF MOVING AT LEAST TWO ELEMENTS OF A PLACEMENT MACHINE

BACKGROUND

The invention relates to a method for moving at least two elements of a placement machine in, and opposite to, a predetermined direction, in which the second element is moved by means of the first element. The invention also relates to a placement machine suitable for executing such a method.

A conventional placement machine (and its associated method) is disclosed in international patent application WO 97/38567, in which an arm forming a first element is movable in, and opposite to, a Y direction. To the arm is attached a guide forming a second element, which guide is moved along with the arm when the latter is moved in Y-direction. In this machine, the guide is also movable in another direction that extends transverse to the predetermined direction and that is denoted an X direction.

The guide comprises a component placement element by means of which a component can be picked-up from a pick-up plate and subsequently can be placed on a desired position onto the substrate. For this purpose, the arm, the guide, and the component placement element are moved in common in, or opposite to, the Y-direction and the X-direction. Near to the pick-up position and the desired position on the substrate the component pick-up element is temporarily stopped to enable it to pick-up and place the component, respectively. To enable a relatively fast pick-up and placement of components, the relatively heavy arm and the component placement element are moved as fast as possible between the pick-up position and the desired position on the substrate.

The rapid movement of the arm and the component placement element leads to relatively large acceleration and deceleration forces. As the accuracy with which a relatively light component is picked-up or moved should be relatively high, stringent requirements must be placed on the driving and guiding of the arm. This heightened accuracy requirement presents a problem that is not only found in component placement machines, but in any placement machine with which a relatively small mass is to be moved quickly and by means of a relatively large mass.

SUMMARY

It is an object of the present invention to provide a method for moving at least two elements in which the second element can be moved comparatively accurately and quickly to a desired position by means of the first element. This object is achieved in the method according to the invention in that the first element is moved in the predetermined direction while at the same time the second element is moved relative to the first element in a direction opposite to the predetermined direction and vice versa. Accordingly, it is possible, for example, to move the first element together with the second element to a desired position in a comparatively fast manner.

During the movement of the first and second elements near the desired position, the second element is moved in an opposite direction to the first element. As a result, the second element undergoes a compound movement that is in a direction opposite to the predetermined direction and that is determined by the movement of the first element in the predetermined direction or vice versa. The compound movement of the second element may be comparatively small or even zero. As a result, the second element may be brought to a standstill without also bringing the first element to a relative standstill and, therefore, no large deceleration forces will be applied to the first element.

An embodiment of the method according to the invention is characterized in that the first element may be moved in the predetermined direction over a distance that is substantially equal to the distance over which the second element is moved in opposite direction. The resulting or compound distance over which the second element is relatively moved will then be substantially equal to zero. This makes it possible for the first element to be moved, whereas the second element remains relatively stopped.

A further embodiment of the method according to the invention is characterized in that the first element may be moved in the predetermined direction with a speed that is substantially equal to the speed with which the second element is moved in opposite direction. In this way, the resulting speed with which the second element is relatively moved is substantially equal to zero, whereas the speed of the first element need not be adjusted.

A further embodiment of the method according to the invention is characterized in that the second element may also be moved in a direction that extends transverse to the predetermined direction. In this way the second element may be moved in a plane that extends parallel to the predetermined direction and the transverse direction.

Yet a further embodiment of the method according to the invention is characterized in that the second element may comprise a component placement element that relative to the second element, is moved in a placement direction that extends transverse to the predetermined direction. By means of a component placement element, it is possible for a component to be moved accurately and quickly to a desired position by means of the placement machine.

Yet a further embodiment of the method according to the invention is characterized in that the second element may comprise an imaging device by which images may be made. By means of the imaging device it is possible to make images of a desired position to which the second element is to be moved; this imaging may be carried out while the second element is being moved. This enables the second element to be driven relative to the first element so that the second element may be accurately moved close to the desired position.

The invention is also based on a placement machine that avoids the disadvantages of the conventional machine. The placement machine according to the invention comprises at least two elements that are movable in, and opposite to, a predetermined direction. The second element is movable with the aid of the first element. Both the first element and the second element are further movable relative to each other in, and opposite to, a predetermined direction. As a result, it is possible to bring the second element to a relative standstill while the first element is moving, for example, at a constant speed, by moving the second element in the opposite direction. The second element mass to be brought to a relative standstill with this action may be comparatively small, so that comparatively small acceleration forces will occur.

It is to be understood that both the foregoing general description and the following detailed description are exemplary and explanatory only, and are not restrictive of the invention as claimed.

BRIEF DESCRIPTION OF THE DRAWINGS

These and other features, aspects, and advantages of the present invention will become apparent from the following description, appended claims, and the accompanying exemplary embodiments shown in the drawings, which are briefly described below.

DETAILED DESCRIPTION

Figure 1:
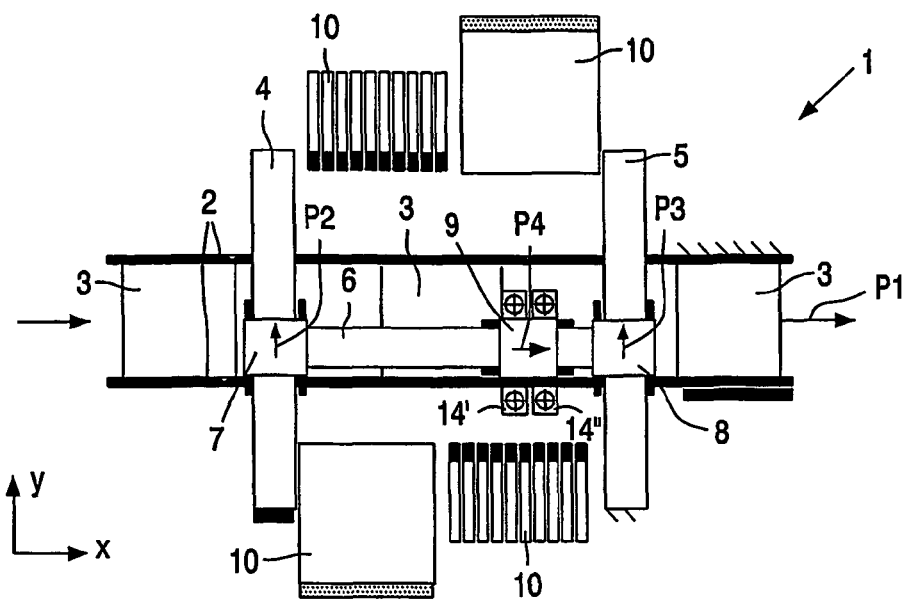
FIG. 1 is a plan view of a component placement machine according to the invention.

In the Figures like elements carry like reference numerals.

FIG. 1 shows a component placement machine 1 according to the invention. The component placement machine 1 comprises an elongated frame 2 over which a substrate 3 can be moved in, and opposite to, a direction indicated by arrow $P_1$. The direction indicated by arrow $P_1$ extends parallel to the X-direction. The component placement machine 1 further comprises two guide rails 4, 5 that are parallel to each other and that extend in the Y-direction, i.e., traverse to the X-direction. The guide rails 4, 5 are located over the frame 2. Between the guide rails 4, 5 is an arm 6 that on either end comprises a guide 7, 8 (i.e., first element) by means of which the arm 6 is slidably supported on bearings over the guide rails 4, 5. The guides 7, 8 each comprise a motor by which the guides 7, 8 are movable over the guide rails 4, 5 in, and opposite to, the directions indicated by the arrows $P_2$, $P_3$, respectively. A guide 9 is movable over the arm 6 by means of a motor in, and opposite to, the X-direction indicated by the arrow $P_4$. The component placement machine 1 further comprises a number of component feeding devices 10 arranged on both sides of the frame 2 between the guide rails 4, 5.

The component placement machine 1 described so far is known per se, for example, from international patent application WO 97/38567, which was previously discussed. For this reason, the operation of the component placement machine 1 will be concisely elucidated. Substrates 3 are moved in steps in the direction indicated by the arrow $P_1$ over the frame 2. Components are positioned on the substrates 3 in the area between the guide rails 4, 5 by means of the component placement element. For this purpose, the guide 9 is moved over the arm 6 while at the same time the guides 7, 8 are moved over the guide rails 4, 5, so that a desired component can be picked-up from the component feeding devices 10 by means of the component placement element. Subsequently, the component placement element is taken to a desired position above the substrate 3 via the guides 7, 8 after which the component is positioned in the Z direction at the desired position on the substrate by means of the component placement element.

The mass of the component to be placed is often less than 1 gram whereas the total mass of the guides 7, 8, 9 and the arm 6 is, for example, 65 to 80 kg. During the movement in, for example, the Y-direction, this whole mass is constantly moved to and fro between the component feeding devices 10 and the desired position on the substrate 3. To be able to place a comparatively large number of components per time unit, the arm 6 must be moved to and fro comparatively quickly. It should also be possible to bring the arm 6 to a standstill quickly and to likewise reset the arm 6 in motion quickly.

As a result of the large weight of the arm 6 compared with the weight of the component to be placed, comparatively large acceleration and deceleration forces may occur during this movement. In addition or alternatively, vibrations may occur during this movement; such vibrations must first be dampened to achieve the desired positioning accuracy; this damping takes extra time.

The aforementioned acceleration forces and deceleration forces and/or vibrations do not occur with a component placement machine 11 according to the present invention. The component placement machine 11 will be further explained with reference to FIGS. 2 and 3. The component placement machine 11 includes a guide 7 that is movable over a guide rail 4 in, and opposite to, the Y-direction indicated by the arrow $P_2$. For sake of clarity, the arm 6 and the guide 9 have been omitted in FIGS. 2 and 3. A guide 13 (i.e., second element), which supports a component placement element 12, can be directly moved over a guide rail 14 connected with the guide 7. The guide rail 14 extends parallel to the guide rail 4. The guide 13 can be moved in, and opposite to, the Y-direction, as indicated by arrow $P_5$. The direction indicated by arrow $P_5$ extends parallel to the direction indicated by arrow $P_2$.

Figure 2:
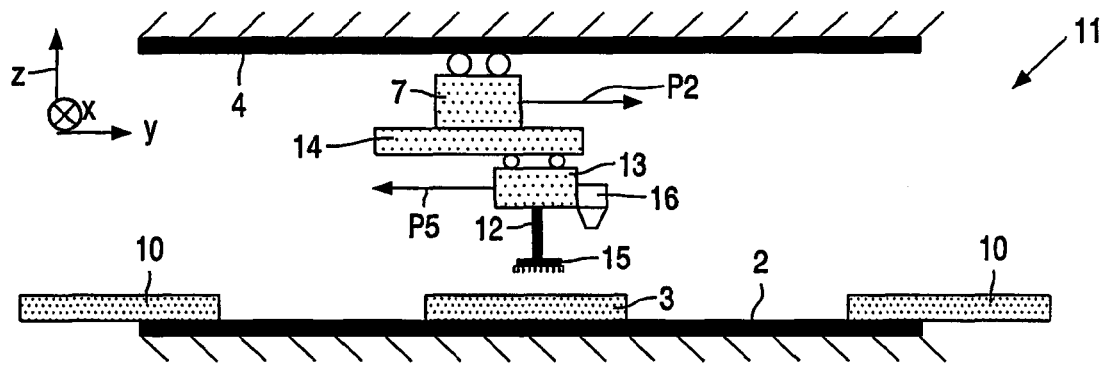
FIG. 2 is a diagrammatic representation of a placement machine according to the invention, in which the second element is located close to the desired placement position.

In the situation shown in FIG. 2, a component 15 has already been fed from the component feeding device 10 by means of the component placement element 12. The component 15 is to be placed at a desired position on the substrate 3. For this purpose, the guide 7 together with the connected guide 13 is moved in the direction indicated by arrow $P_2$ at a comparatively high speed. As soon as the component placement element 12 comes in the neighborhood of the desired position on the substrate 3, the guide 13 is moved, by means of a regulator, in the direction indicated by arrow $P_5$, i.e., opposite to the direction indicated by arrow $P_2$. The placement of the guide 13 in the direction indicated by the arrow $P_5$ is regulated such that the component 15 is immobile relative to the substrate 3 above the desired position on the substrate 3 at which the component is to be placed. As only the speed and movement of the comparatively light guide 13 needs to be regulated in the neighborhood of the desired position on the substrate 3, the consequent acceleration and deceleration forces will be comparatively small. As a result, the component 15 can be placed on the substrate 3 with high accuracy, while the speed at which the total mass of the guides 7, 13 is moved in the direction indicated by arrow $P_2$ can be comparatively high. Moreover, the mass of the guides 7, 13 can keep moving steadily, thereby precluding attendant acceleration/deceleration forces and/or vibrations.

Figure 3:
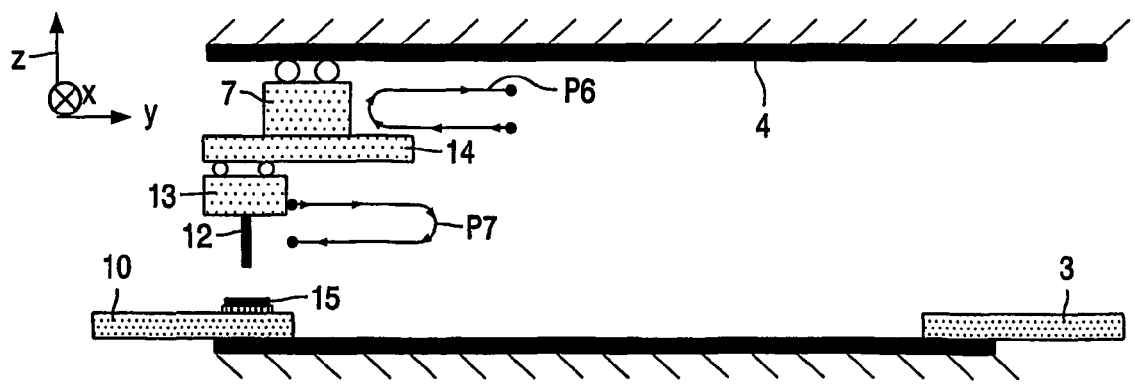
FIG. 3 is a diagrammatic representation of the placement machine shown in FIG. 2 in which the second element is located near a pick-up position.

FIG. 3 shows the placement machine 11 represented in FIG. 2 when a component 15 is being picked-up from a component feeding device 10. The guide 7 is first moved in a direction opposite to the arrow $P_2$ from a position above the substrate 3 to a position located above the component feeding device 10. Subsequently, the guide 7 is to be moved again in the direction indicated by the arrow $P_2$ to the position located above the substrate 3. This reciprocating movement of the guide 7 is indicated by the arrow $P_6$. To avoid comparatively high acceleration and deceleration forces and/or vibrations, in the neighborhood of the component feeding device 10, the guide 13 is moved in the direction indicated by the arrow $P_7$ over the guide rail 14. The superposed movement of the component placement element 12 is such that the component placement element 12 stands still for a moment at the desired position above the component feeding device 10, thereby enabling the component 15 to be picked-up from the component feeding device 10. The guide 7 can be slowed down comparatively slowly during the pick-up phase and accelerated again to be able to change direction of movement, while ensuring that there are comparatively small deceleration and acceleration forces. In contrast, the light guide 13 can undergo comparatively large decelerations and accelerations that result in comparatively small deceleration and acceleration forces, as a result of the comparatively light weight.

If the placement machine 11 according to the invention is used in the component placement machine 1 shown in FIG. 1, the guide rail 14 can be connected with the guide 9, for example, on a side of the arm 6 facing the frame 2. FIG. 1 gives a diagrammatic view of such a guide rail 14 having reference numeral 14'.

The guide 7 can be moved with a speed of 2 meters per second, whereas the time needed for picking-up or placing a component may be, for example, 100 ms. As a result, the length of the guide rail 14 should be about 200 mm to enable sufficient movement of the guide 13.

It is also possible to have the comparatively light guide 13 moveable in both the X and Y directions but opposite to the direction of the comparatively heavy guide.

It is alternatively possible to provide the guide 9 with a second guide rail 14" by means of which a second component placement element 12 can be moved. In this fashion it is possible to pick-up two components at the same time (or in succession) from the component feeding devices 10 and then place them simultaneously (or in succession) on a substrate 3.

It is alternatively possible to provide the guide 13 not only with a component placement element 12 but also with a camera 16 (i.e., image sensor) by means of which a pick-up position on the component feeding device 10 a desired placement position on the substrate 3 can be observed prior to picking-up and placing a component 15, respectively. Based on the images perceived by the camera 16, an accurate driving of the guide 13 relative to the guide rail 14 can be realized. It is also possible for the camera 16 to be installed on a separate guide that can be moved over a separate guide rail.

The component placement element 12, for example, comprises a pick up tube that can be moved relative to the guide 13 in, and opposite to, the Z direction that extends transversely to the X and Y-direction.

Given the disclosure of the present invention, one versed in the art would appreciate that there may be other embodiments and modifications within the scope and spirit of the invention. Accordingly, all modifications attainable by one versed in the art from the present disclosure within the scope and spirit of the present invention are to be included as further embodiments of the present invention. The scope of the present invention is to be defined as set forth in the following claims.

The invention claimed is:

1. A method of moving at least two elements using a placement machine comprising the steps of:
    moving a first of the two elements in a predetermined direction to cause a corresponding movement of the second of the two elements in the predetermined direction; and
    while the first element moves in the predetermined direction, at a desired position moving the second element relative to the first element in a direction opposite to the predetermined direction to cause the second element to be stationary relative to the desired position.

2. The method as claimed in claim 1, wherein the first element is moved in the predetermined direction over a distance that is substantially equal to the distance over which the second element is moved in the opposite direction.

3. The method as claimed in claim 1, wherein the first element is moved in the predetermined direction with a speed that is substantially equal to the speed with which the second element is moved in the opposite direction.

4. The method as claimed in claim 1, further comprising the step of:
    moving the second element in a direction that extends transverse to the predetermined direction.

5. The method as claimed in claim 1, wherein the second element comprises a component placement element that is moved in a direction that extends transverse to the predetermined direction.

6. The method as claimed in claim 1, wherein the second element comprises an image sensor.

7. The method as claimed in claim 6, further comprising the step of:
    imaging, using the image sensor, component pick-up and/or placement positions.

\* \* \* \* \*